United States Patent [19]
Hirata et al.

[11] Patent Number: 6,009,024
[45] Date of Patent: Dec. 28, 1999

[54] SEMICONDUCTOR MEMORY

[75] Inventors: Takashi Hirata, Neyagawa; Hiroyuki Yamauchi, Takatsuki; Hironori Akamatsu, Hirakata; Keiichi Kusumoto, Nishinomiya; Toru Iwata, Osaka; Satoshi Takahashi, Hirakata; Yutaka Terada, Osaka, all of Japan

[73] Assignee: Matsushita Electric Industrial Co., Ltd., Kadoma, Japan

[21] Appl. No.: 09/046,880

[22] Filed: Mar. 24, 1998

[30] Foreign Application Priority Data

Mar. 27, 1997 [JP] Japan .................................. 9-076317

[51] Int. Cl.⁶ ............................................ G11C 7/00
[52] U.S. Cl. ................................... 365/190; 365/207
[58] Field of Search .................................. 365/207, 205, 365/190

[56] References Cited

U.S. PATENT DOCUMENTS

| | | | |
|---|---|---|---|
| 4,545,037 | 10/1985 | Nakano et al. | 365/205 |
| 5,392,240 | 2/1995 | Muraoka | 365/189.01 |
| 5,491,655 | 2/1996 | Hirose et al. | 365/207 |

FOREIGN PATENT DOCUMENTS

| | | |
|---|---|---|
| 62-043892 | 2/1987 | Japan . |
| 63-229693 | 9/1988 | Japan . |
| 2044767 | 2/1990 | Japan . |
| 2143982 | 6/1990 | Japan . |
| 8153856 | 6/1996 | Japan . |
| 9082086 | 3/1997 | Japan . |

*Primary Examiner*—David Nelms
*Assistant Examiner*—M. Tran
*Attorney, Agent, or Firm*—Renner, Otto, Boisselle & Sklar, P.L.L.

[57] ABSTRACT

A semiconductor memory of the present invention includes: a plurality of memory cells; a pair of local bit lines connected to the plurality of memory cells; a local sense amplifier for amplifying a potential difference between the pair of local bit lines; a pair of global bit lines electrically connected to the pair of local bit lines through a switch; and a global sense amplifier for amplifying a potential difference between the pair of global bit lines, wherein the local sense amplifier includes a plurality of transistors, each of the plurality of transistors included in the local sense amplifier is a transistor of a first conductivity type, and the global sense amplifier includes a transistor of a second conductivity type different from the first conductivity type.

20 Claims, 14 Drawing Sheets

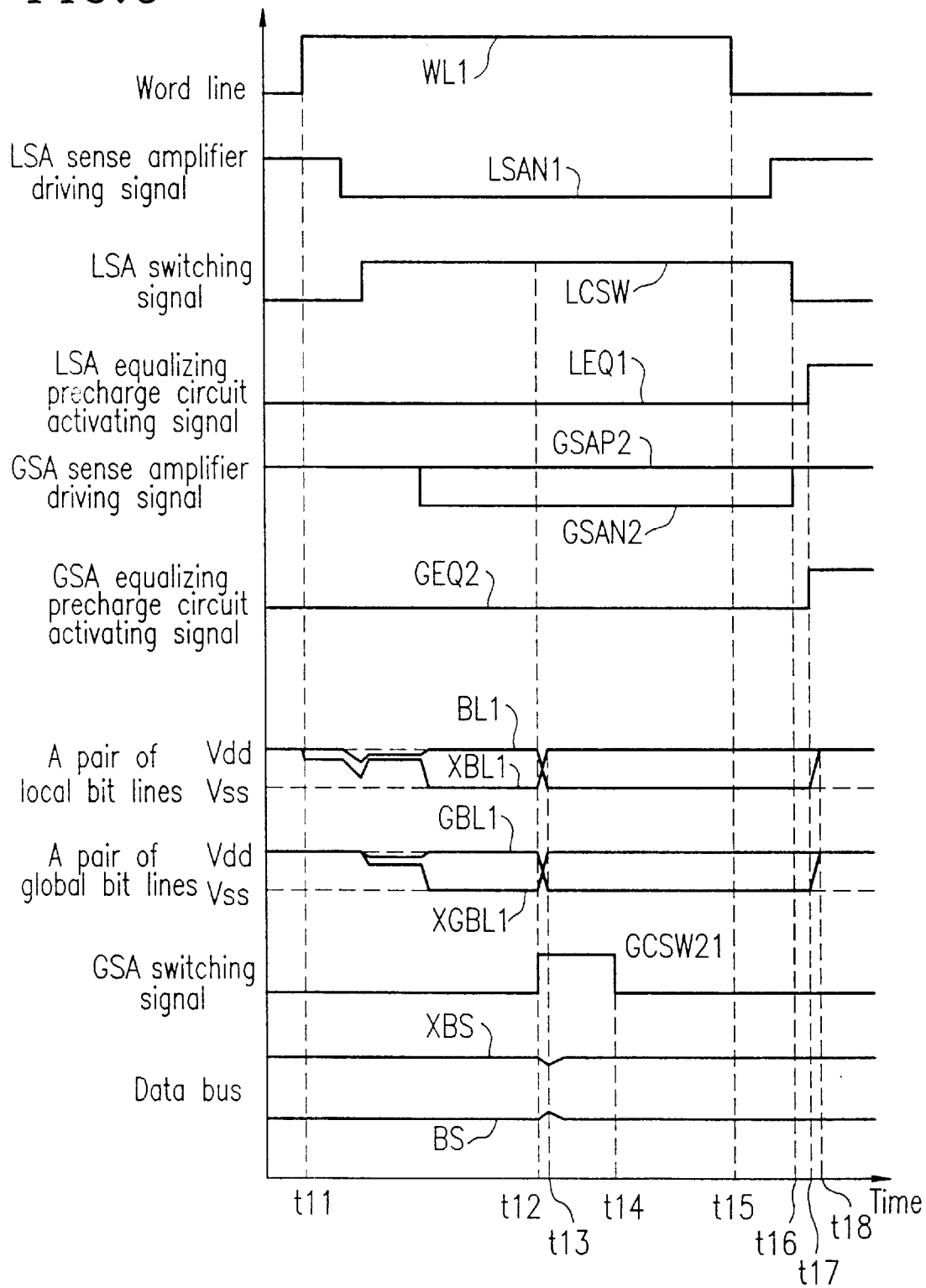

SEMICONDUCTOR MEMORY

BACKGROUND OF THE INVENTION

1. Field of the Invention

The present invention relates to a semiconductor memory, and particularly to a highly integrated semiconductor memory with a decreased area.

2. Description of the Related Art

High integration and decrease in area are required of a semiconductor memory. The high integration and decrease in area of a semiconductor memory depends upon the advancement of micro-lithography. With the micro-lithography, a micro-lithography process based on miniaturization of a processing dimension, such as a 0.2 µm process and a 0.15 µm process, has been developed. However, there will be a limit to such miniaturization of a processing dimension.

In order to realize high integration and decrease in area of a semiconductor memory, the arrangement of memory cells and sense amplifiers on a circuit, as well as the micro-lithography are important. This is because the area of the semiconductor memory is mostly occupied with the memory cells and the sense amplifiers.

As described in Japanese Laid-open Publication No. 2-4467, as a method for arranging memory cells and sense amplifiers, a folded bit line method and an open bit line method are known. According to the folded bit line method, a bit line and a / bit line are arranged on one side of a sense amplifier portion (hereinafter, the symbol "/" refers to a logical NOT bar). According to the open bit line method, a bit line is arranged on one side of a sense amplifier portion, and a / bit line is arranged on the other side of the sense amplifier portion. The folded bit line method has the advantage of resistance to noise. However, in this method, memory cells are arranged at every other crossing point of bit lines and word lines, so that high integration cannot be achieved. The open bit line method has the disadvantage of vulnerability to noise. However, memory cells can be arranged densely, so that high integration can be realized.

In recent years, since the high integration of a semiconductor memory has advanced, and noise or the like caused by a coupling capacitance between lines becomes significant, the folded bit line method does not necessarily have the advantage of the resistance to noise. Because of this, an open bit line method capable of realizing high integration is being considered.

As a sense amplifier of a semiconductor memory, as described in Japanese Laid-open Publication No. 2-4467, a sense amplifier composed of a CMOS circuit using PMOS transistors and NMOS transistors is known.

However, when both a PMOS transistor and an NMOS transistor are used for a sense amplifier, a well is required for separating the PMOS transistor and the NMOS transistor. This makes it difficult to decrease the area of the sense amplifier.

If the open bit line method is used, a pair of bit lines will become imbalanced, which worsens the sensitivity of a sense amplifier, resulting in a delay of access time and an increased cycle time.

SUMMARY OF THE INVENTION

A semiconductor memory of the present invention includes: a plurality of memory cells; a pair of local bit lines connected to the plurality of memory cells; a local sense amplifier for amplifying a potential difference between the pair of local bit lines; a pair of global bit lines electrically connected to the pair of local bit lines through a switch; and a global sense amplifier for amplifying a potential difference between the pair of global bit lines, wherein the local sense amplifier includes a plurality of transistors, each of the plurality of transistors included in the local sense amplifier is a transistor of a first conductivity type, and the global sense amplifier includes a transistor of a second conductivity type different from the first conductivity type.

In one embodiment of the present invention, the transistor of the first conductivity type is an NMOS transistor, and the transistor of the second conductivity type is a PMOS transistor.

In another embodiment of the present invention, the pair of local bit lines includes a first local bit line and a second local bit line, and a length of the first local bit line is substantially equal to a length of the second local bit line.

In another embodiment of the present invention, the plurality of memory cells includes a first memory cell and a second memory cell, the transistors of the first conductivity include a first transistor and a second transistor, each of the first transistor and the second transistor has a source, a gate, and a drain, the first local bit line is connected to the gate of the second transistor and a first node, the second local bit line is connected the gate of the first transistor and a second node, the first local bit line includes a first end portion on the first memory cell side with respect to the local sense amplifier, the second local bit line includes a second end portion on the second memory cell side with respect to the local sense amplifier, and a first distance between the first node and the first end portion is substantially equal to a second distance between the second node and the second end portion.

In another embodiment of the present invention, the plurality of memory cells includes a first memory cell and a second memory cell, the transistors of first conductivity include a first transistor and a second transistor, each of the first transistor and the second transistor has a source, a gate, and a drain, the first local bit line is connected to the drain of the first transistor and a first node, the second local bit line is connected to the drain of the second transistor and a second node, the first local bit line includes a first end portion on the first memory cell side with respect to the local sense amplifier, the second local bit line has a second end portion on the second memory cell side with respect to the local sense amplifier, and a first distance between the first node and the first end portion is substantially equal to a second distance between the second node and the second end portion.

In another embodiment of the present invention, the pair of local bit lines includes a first local bit line, and the global sense amplifier amplifies a potential difference between the pair of global bit lines, in response to which an electric potential of the first local bit line is restored to a predetermined first electric potential.

In another embodiment of the present invention, the predetermined first electric potential is a precharge electric potential for precharging the pair of local bit lines.

In another embodiment of the present invention, the transistor of the first conductivity type is an NMOS transistor, the transistor of the second conductivity type is a PMOS transistor, the local sense amplifier amplifies a potential difference between the pair of local bit lines, in response to which an electric potential of the first local bit line decreases to a second electric potential lower than the precharge electric potential from the precharge electric potential, and the global sense amplifier amplifies a potential difference between the pair of global bit lines, in response to which an electric potential of the first local bit line is restored to the precharge electric potential from the second electric potential.

In another embodiment of the present invention, the pair of global bit lines are electrically connected to a plurality of the pairs of local bit lines through the switch.

In another embodiment of the present invention, the pair of global bit lines are electrically connected to each of the plurality of pairs of local bit lines in time division, In another embodiment of the present invention, the pair of global bit lines are electrically connected to each of the plurality of pairs of local bit lines in time division in response to a single external signal.

In another embodiment of the present invention, the pair of global bit lines are arranged in a direction crossing the pair of local bit lines.

Thus, the invention described herein makes possible the advantages of (1) providing a semiconductor memory with a decreased area of a sense amplifier; and (2) a semiconductor memory in which the imbalance between pairs of bit lines is eliminated in an open bit line method.

These and other advantages of the present invention will become apparent to those skilled in the art upon reading and understanding the following detailed description with reference to the accompanying figures.

BRIEF DESCRIPTION OF THE DRAWINGS

FIG. 6 is a timing diagram illustrating an operation of writing data into the memory cell of the semiconductor memory in Embodiment 1 of the present invention.

DESCRIPTION OF THE PREFERRED EMBODIMENTS

Hereinafter, the present invention will be described by way of illustrative embodiments with the reference to the drawings.

Embodiment 1

Figure 1:
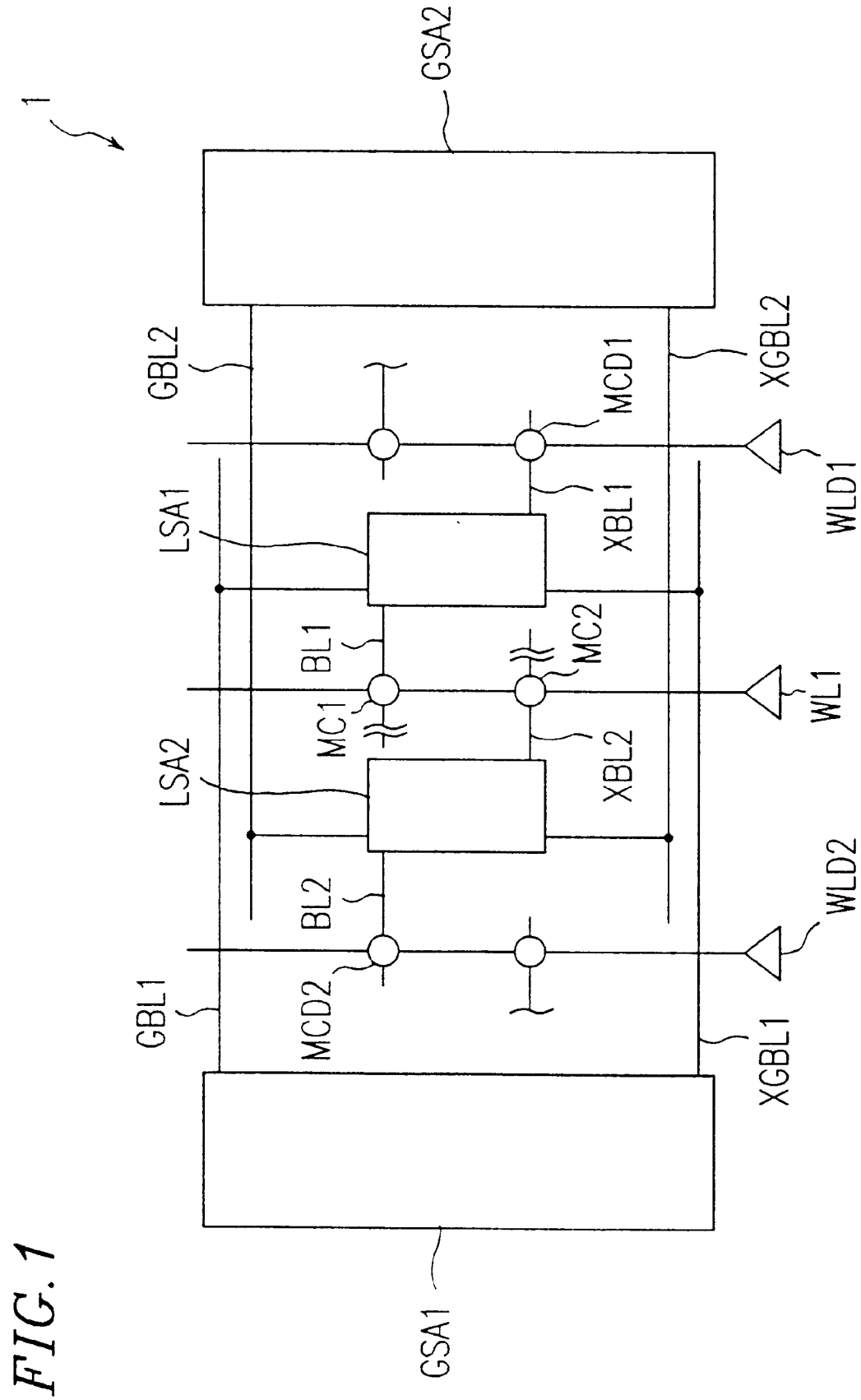
FIG. 1 shows a configuration of a semiconductor memory in Embodiment 1 of the present invention.

FIG. 1 shows a configuration of a semiconductor memory 1. The semiconductor memory 1 includes memory cells MC1, MCD1, MC2, and MCD2. A pair of local bit lines BL1 and XBL1 are respectively connected to the memory cells MC1 and MCD1. A pair of local bit lines XBL2 and BL2 are respectively connected to the memory cells MC2 and MCD2.

The semiconductor memory 1 further includes a local sense amplifier block LSA1 for amplifying the potential difference between a pair of the local bit lines BL1 and XBL1, and a local sense amplifier block LSA2 for amplifying the potential difference between a pair of the local bit lines BL2 and XBL2. In the semiconductor memory 1, the memory cells MCl, MCD1, MC2, and MCD2, and the local sense amplifier blocks LSA1 and LSA2 are arranged in accordance with an open bit line method. A pair of global bit lines GBL1 and XGBL1 are connected to the local sense amplifier block LSA1. A pair of the global bit lines GBL2 and XGBL2 are connected to the local sense amplifier block LSA2. A pair of the global bit lines GBL1 and XGBL1 are electrically connected to a pair of local bit lines BL1 and XBL1, respectively, through switches (not shown) provided in the local sense amplifier block LSA1. A pair of the global bit lines GBL2 and XGBL2 are electrically connected to a pair of local bit lines BL2 and XBL2 through switches (not shown) provided in the local sense amplifier block LSA2. These switches will be described later.

The semiconductor memory 1 further includes a global sense amplifier block GSA1 for amplifying the potential difference between a pair of the global bit lines GBL1 and XGBL1 and a global sense amplifier block GSA2 for amplifying the potential difference between a pair of the global bit lines GBL2 and XGBL2. A word line WL1 is connected to the memory cells MC1 and MC2. A word line WLD1 is connected to the memory cell MCD1. A word line WLD2 is connected to the memory cell MCD2.

Figure 2:
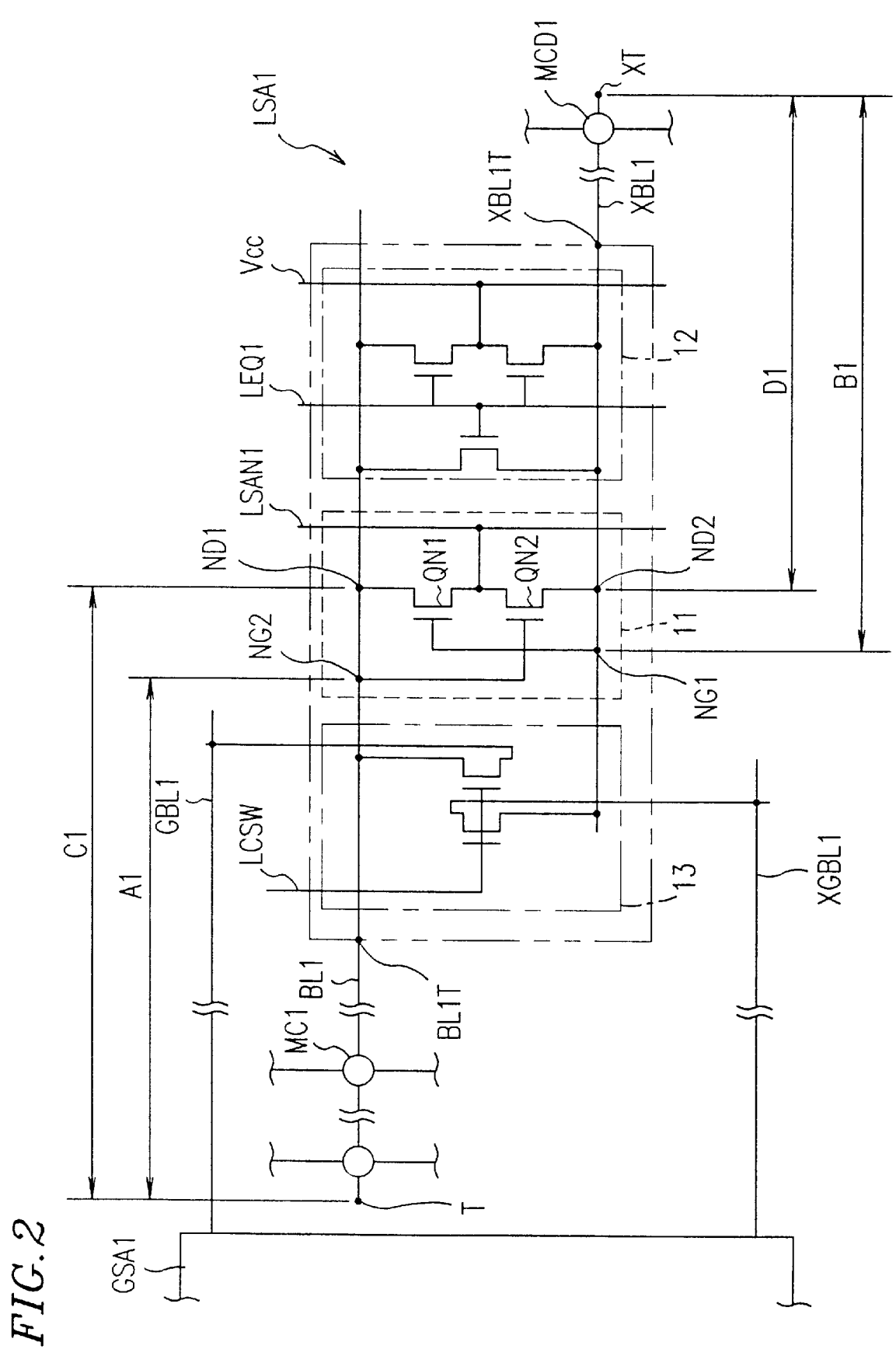
FIG. 2 is a circuit diagram of a local sense amplifier block and a peripheral circuit thereof in Embodiment 1 of the present invention.

FIG. 2 shows a configuration of the local sense amplifier block LSA1 and a peripheral circuit thereof. In FIG. 2, the reference numerals identical with those in FIG. 1 denote the parts identical with those therein. Therefore, the description thereof will be omitted.

The local sense amplifier block LSA1 includes a switch 13, a local sense amplifier 11, and an equalizing precharge circuit 12. The switch 13 connects a pair of the local bit lines BL1 and XBL1 to a pair of the global bit lines GBL1 and XGBL1, respectively, in response to an LSA switching signal LCSW. The equalizing precharge circuit 12 is supplied with a power $V_{cc}$. The equalizing precharge circuit 12 precharges a pair of the local bit lines BL1 and XBL1 in response to an LSA equalizing precharge circuit driving signal LEQ1.

The local sense amplifier 11 includes NMOS (N-type Metal Oxide Semiconductor) transistors QN1 and QN2. The NMOS transistors QN1 and QN2 are connected to an LSA sense amplifier driving signal line LSAN1. The local sense amplifier 11 uses the NMOS transistors alone without using PMOS (P-type Metal Oxide Semiconductor) transistors, so that a well is not required to be provided as in the case of using both the PMOS transistor and the NMOS transistor. This enables a layout area of the local sense amplifier 11 to be made smaller, compared with the case of using both the PMOS transistor and the NMOS transistor. Although the NMOS transistors alone are used in the local sense amplifier 11, the present invention is not limited thereto. PMOS transistors alone may be used in the local sense amplifier 11. The case where the local sense amplifier 11 includes two NMOS transistors QN1 and QN2. However, the present invention is not limited thereto. The local sense amplifier 11 may include three or more NMOS transistors.

The local sense amplifier 11 is positioned between the switch 13 and the equalizing precharge circuit 12. A drain of the NMOS transistor QN1 is connected to the local bit line BL1 via a node ND1. A gate of the NMOS transistor QN1 is connected to the local bit line XBL1 via a node NG1. A drain of the NMOS transistor QN2 is connected to the local bit line XBL1 via a node ND2. A gate of the NMOS transistor QN2 is connected to the local bit line BL1 via a node NG2.

Here, it is assumed that A1 is a distance between the node NG2 and an end portion T of the local bit line BL1; B1 is a distance between the node NG1 and an end portion XT of the local bit line XBL1; C1 is a distance between the node ND1 and the end portion T of the local bit line BL1; and D1 is a distance between the node ND2 and the end portion XT of the local bit line XBL1. The local sense amplifier 11 is positioned between the switch 13 and the equalizing precharge circuit 12 in such a manner that the distance A1 is substantially equal to the distance B1, and the distance C1 is substantially equal to the distance D1, as described later with reference to FIG. 3. More specifically, the following Expressions 1 and 2 hold.

$$A1 \approx B1 \quad (1)$$

$$C1 \approx D1 \quad (2)$$

Therefore, the parasitic resistance and capacitance of the local bit line BL1 become equal to those of the local bit line XBL1. This results in that the imbalance between the local bit line BL1 and the local bit line XBL1 in the open bit line method can be eliminated. It is noted that the local sense amplifier block LSA2 has the same circuit configuration as that of the local sense amplifier block LSA1.

Figure 3:
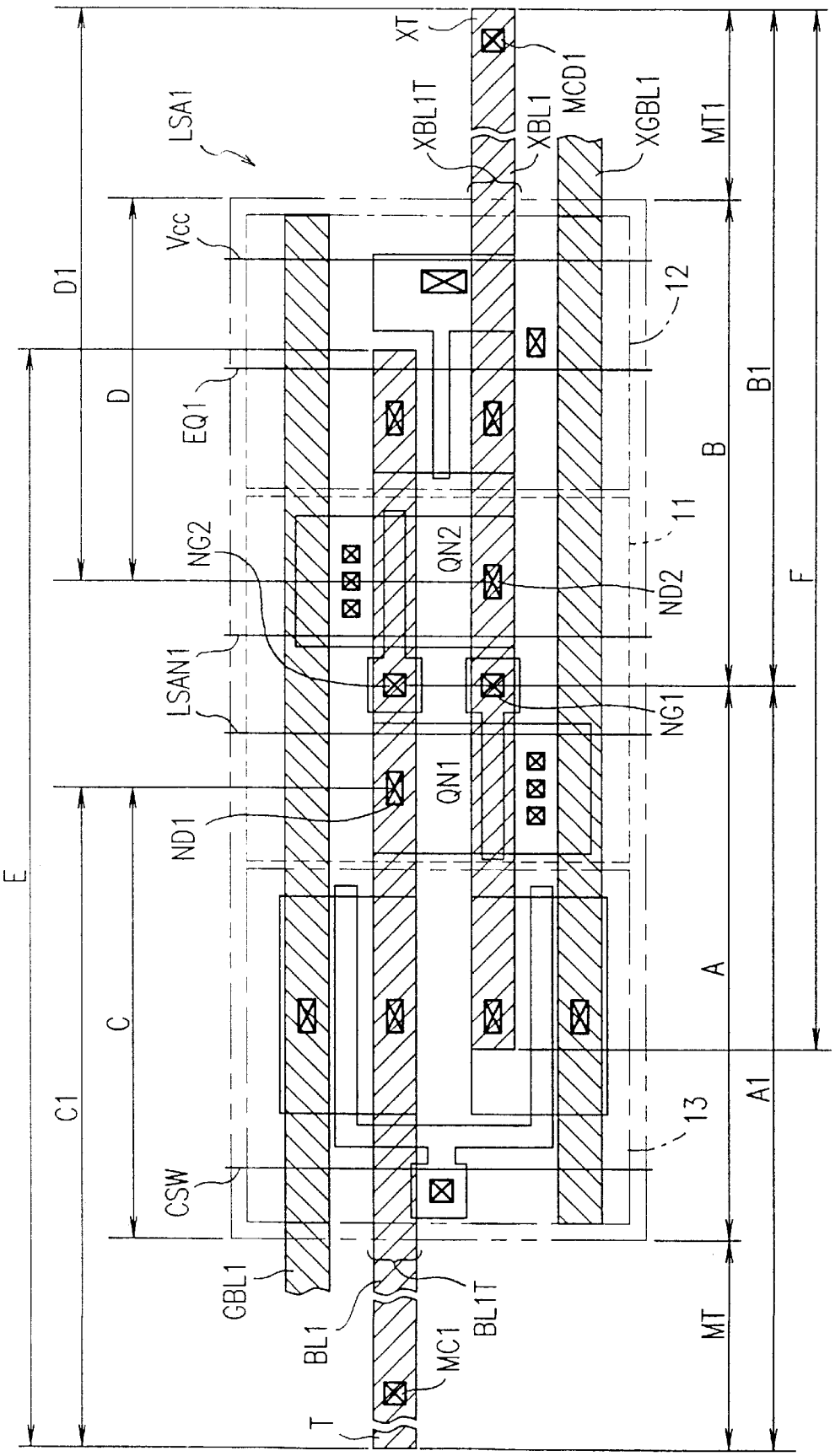
FIG. 3 is a layout diagram of the local sense amplifier block and the peripheral circuit thereof in Embodiment 1 of the present invention.

FIG. 3 shows a layout of the local sense amplifier block LSA1 and a peripheral circuit thereof. In FIG. 3, the reference numerals identical with those in FIG. 2 denote the parts identical with those therein. Therefore, the description thereof will be omitted.

In the local sense amplifier block LSA1, the local sense amplifier 11 is positioned between the switch 13 and the equalizing precharge circuit 12. The drain of the NMOS transistor QN1 is connected to the local bit line BL1 via the node ND1. The gate of the NMOS transistor QN1 is connected to the local bit line XBL1 via the node NG1. The drain of the NMOS transistor QN2 is connected to the local bit line XBL1 via the node ND2. The gate of the NMOS transistor QN2 is connected to the local bit line BL1 via the node NG2.

The local bit line BL1 extends to an inside of the local sense amplifier block LSA1 through an end portion BL1T of the local sense amplifier block LSA1 to be connected to the nodes ND1 and NG2. The local bit line XBL1 extends to an inside of the local sense amplifier block LSA1 through an end portion XBL1T of the local sense amplifier block LSA1 to be connected to the nodes ND2 and NG1. An length E of the local bit line BL1 is substantially equal to a length F of the local bit line XBL1.

Here, it is assumed that A is a distance between the node NG2 and the end portion BL1T; B is a distance between the node NG1 and the end portion XBL1T; C is a distance between the node ND1 and the end portion BL1T; and D is a distance between the node ND2 and the end portion XBL1T. The local sense amplifier 11 is positioned between the switch 13 and the equalizing precharge circuit 12 in such a manner that the distance A is substantially equal to the distance B, and the distance C is substantially equal to the distance D. More specifically, the following Expressions 3 and 4 hold.

$$A \approx B \quad (3)$$

$$C \approx D \quad (4)$$

Here, it is assumed that MT is a distance between the end portion T and the end portion BL1T, and MT1 is a distance between the end portion XT and the end portion XBL1T. The local bit lines BL1 and XBL1 and the local sense amplifier block LSA1 are arranged in such a manner that the distance MT is equal to the distance MT1. More specifically, the following Expression 5 holds.

$$MT \approx MT1 \quad (5)$$

The following Expressions 6 through 9 hold from the arrangement relationship between the local sense amplifier block LSA1 and the local bit lines BL1 and XBL1.

$$A1 = A + MT \quad (6)$$

$$B1 = B + MT1 \quad (7)$$

$$C1 = C + MT \quad (8)$$

$$D1 = D + MT1 \quad (9)$$

From Expressions 3 through 9, the above-mentioned Expressions 1 and 2 hold.

Therefore, the parasitic resistance and capacitance of the local bit line BL1 become equal to those of the local bit line XBL1. This results in that the imbalance between the local bit line BL1 and the local bit line XBL1 can be eliminated in the open bit line method. It is noted that the local sense amplifier block LSA2 has the same layout as that of the local sense amplifier block LSA1.

Figure 4:
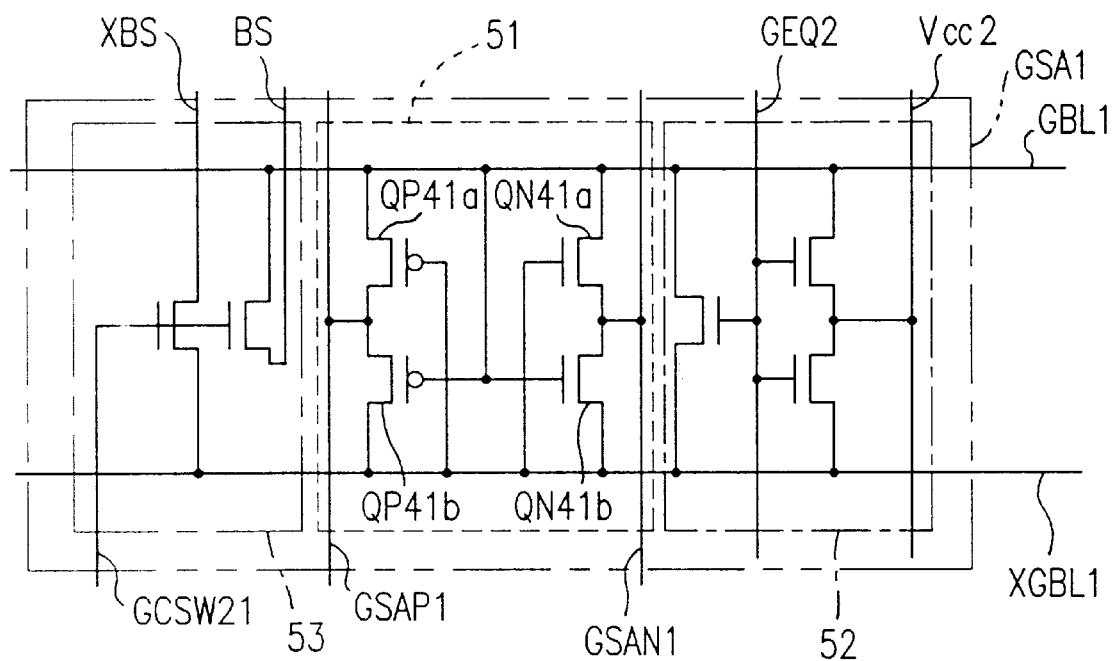
FIG. 4 is a circuit diagram of a global sense amplifier block in Embodiment 1 of the present invention.

FIG. 4 shows a circuit configuration of the global sense amplifier block GSA1. The global sense amplifier block GSA1 includes a switch 53, a global sense amplifier 51, and an equalizing precharge circuit 52. The switch 53 connects a pair of the global bit lines GBL1 and XGBL1 to data buses BS and XBS, respectively, in response to a GSA switching signal GCSW21. The equalizing precharge circuit 52 is supplied with a power $V_{cc}2$. The equalizing precharge circuit 52 precharges a pair of the global bit lines GBL1 and XGBL1 in response to a GSA equalizing precharge circuit driving signal GEQ2.

The global sense amplifier 51 includes PMOS transistors QP41a, QP41b, and NMOS transistors QN41a and QN41b.

The PMOS transistors QP41a and QP41b are connected to GSA sense amplifier driving signal line GSAP1. The NMOS transistors QN41a and QN41b are connected to a GSA sense amplifier driving signal line GSAN1.

Although the case where both the PMOS transistor and the NMOS transistor are used is shown, either the PMOS transistor or the NMOS transistor may be used. For example, in the case where the local sense amplifier 11 uses the NMOS transistor alone, the global sense amplifier 51 may use the PMOS transistor alone. Alternatively, in the case where the local sense amplifier 11 uses the PMOS transistor alone, the global sense amplifier 51 may use the NMOS transistor alone. When either the PMOS transistor or the NMOS transistor is used, a well is not required to be provided as in the case of using both the PMOS transistor and the NMOS transistor. Therefore, a layout area of the global sense amplifier 51 can be decreased, compared with the case of using both the PMOS transistor and the NMOS transistor.

Furthermore, although the case where one local sense amplifier block LSA1 is provided for a pair of the global bit lines GBL1 and XGBL1 is shown, the present invention is not limited thereto. As described later, a plurality of local sense amplifier blocks LSA1 may be provided for a pair of the global bit lines GBL1 and XGBL1.

Figure 5A:
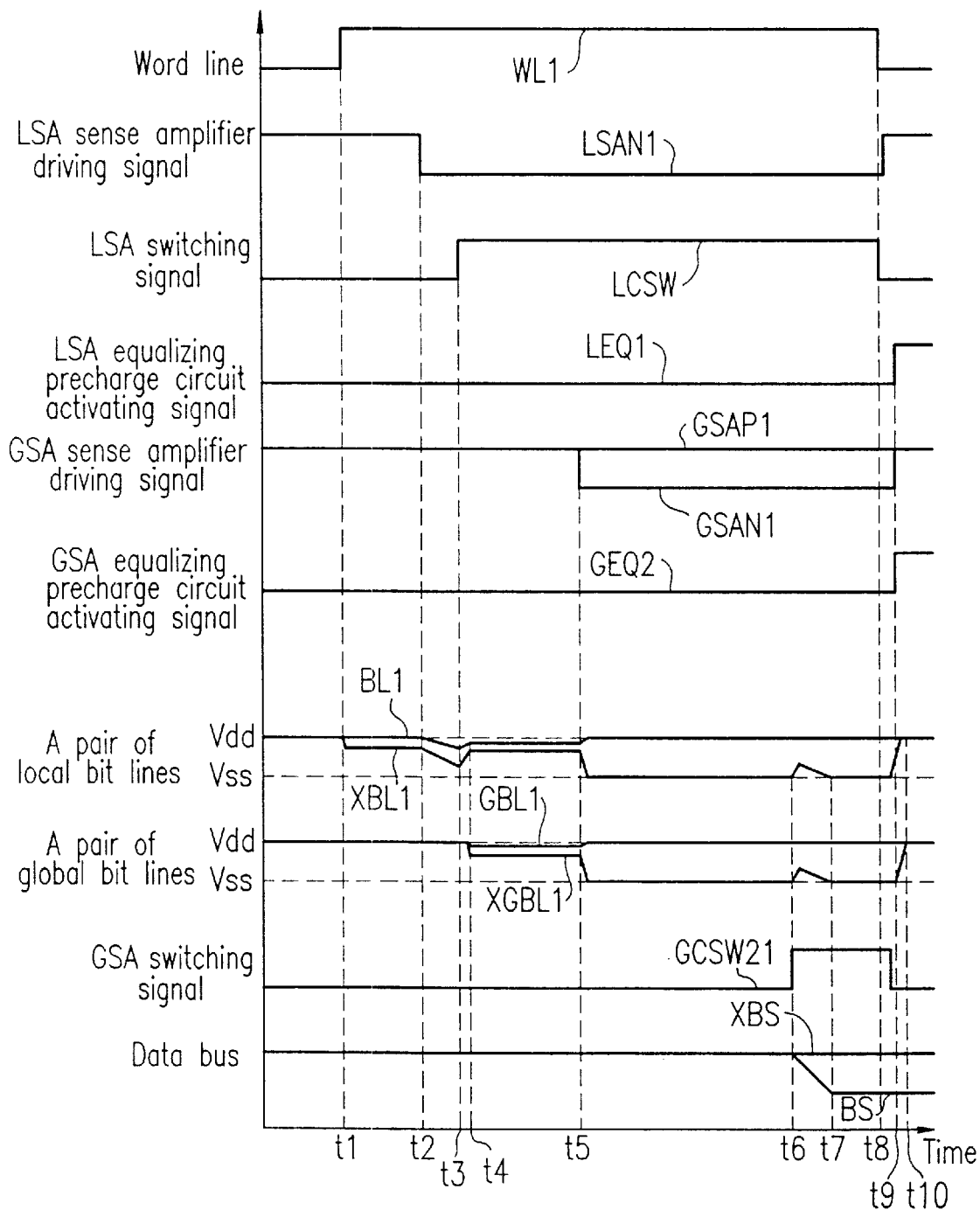
FIG. 5A is a timing diagram illustrating an operation of reading data from a memory cell of the semiconductor memory in Embodiment 1 of the present invention.

FIG. 5A is a timing diagram illustrating an operation of reading data from the memory cell MC1 of the semiconductor memory 1. Herein, a read operation when High data is stored in the memory cell MC1 will be described. Data for generating a reference electric potential is stored in the memory cell MCD1. When the electric potential of the word line WL1 connected to the memory cell MC1 becomes HIGH (hereinafter, HIGH is merely referred to as "H" and LOW is merely referred to as "L") at t1, data stored in the memory cells MC1 and MCD1 is read. When charge accumulated in the memory cells MC1 and MCD1 is read, a potential difference is formed between a pair of the local bit lines BL1 and XBL1.

When the electric potential of the LSA sense amplifier driving signal line LSAN1 shifts from "H" to "L" at t2, the charge on the local bit lines BL1 and XBL1 is discharged into the LSA sense amplifier driving signal line LSAN1 through the NMOS transistors QN1 and QN2. As a result, the electric potentials of the local bit lines BL1 and XBL1 decrease. The electric potential of the local bit line XBL1 is lower than the local bit line BL1. The electric potential of the local bit line XBL1, which is lower than that of the local bit line BL1, decreases more than that of the local bit line BL1. In this way, the potential difference between a pair of the local bit lines BL1 and XBL1 is amplified by the local sense amplifier block LSA1.

When a predetermined potential difference is formed between a pair of local bit lines BL1 and XBL1 at t3, the electric potential of the LSA switching signal LCSW shifts from "L" to "H", whereby the local bit lines BL1 and XBL1 are connected to the global bit lines GBL1 and XGBL1, respectively. When the local bit lines BL1 and XBL1 are connected to the global bit lines GBL1 and XGBL1, the charge of the global bit line GBL1 moves to the local bit line BL1, and the charge of the global bit line XGBL1 moves to the local bit line XBL1. Therefore, the electric potential of the local bit line BL1 increases, and the electric potential of the global bit line GBL1 decreases. Furthermore, the electric potential of the local bit line XBL1 increases and the electric potential of the global bit line XGBL1 decreases.

When the electric potential of the global bit line GBL1 becomes equal to that of the local bit line BL1 at t4, the increase in the electric potential of the local bit line BL1 and the decrease in the electric potential of the global bit line XGBL1 are completed, respectively. When the electric potential of the global bit line XGBL1 becomes equal to that of the local bit line XBL1, the increase in the electric potential of the global bit line XGBL1 and the decrease in the electric potential of the local bit line XBL1 are completed, respectively.

When the electric potential of the GSA sense amplifier driving signal line GSAN1 shifts from "H" to "L" at t5, the charge of the global bit line XGBL1 is discharged to the GSA sense amplifier driving signal line GSAN1 through the NMOS transistor QN41b, so that the electric potential of the global bit line XGBL1 further decreases to become a reference electric potential $V_{ss}$. Since the charge is supplied from the GSA sense amplifier driving signal line GSAP1 to the global bit line GBL1, the electric potential of the global bit line GBL1 is restored to a precharge electric potential $V_{dd}$. In this way, the potential difference between a pair of the global bit lines GBL1 and XGBL1 is amplified by the global sense amplifier block GSA1.

Since the local bit lines BL1 and XBL1 are connected to the global bit lines GBL1 and XGBL1, respectively, the local bit lines BL1 and XBL1 will have the same electric potentials as those of the global bit lines GBL1 and XGBL1, respectively. Therefore, the electric potential of the local bit line XBL1 decreases to the same electric potential as that of the global bit line XGBL1 (i.e., the reference electric potential $V_{ss}$), and the electric potential of the local bit line BL1 is restored to the precharge electric potential $V_{dd}$ which is the same as that of the global bit line GBL1. In this way, the global sense amplifier block GSA1 amplifies the potential difference between a pair of global bit lines GBL1 and XGBL1, in response to which the electric potential of the local bit line BL1 is restored to the precharge electric potential $V_{dd}$.

When the electric potential of the GSA switching signal GCSW21 becomes "H" at t6, the global bit lines GBL1 and XGBL1 are connected to the data buses BS and XBS, respectively. At t7, the electric potentials of the global bit lines GBL1 and XGBL1 are transferred to the data buses BS and XBS. When the electric potential of the word line WL1 shifts from "H" to "L" at t8, data read from the memory cell MC1 is restored (rewritten) in the memory cell MC1. When the LSA equalizing precharge circuit driving signal LEQ1 and the GSA equalizing precharge circuit driving signal GEQ2 shift to "H" at t9, the global bit lines GBL1 and XGBL1 and a pair of the local bit lines BL1 and XBL1 are respectively precharged with the precharge electric potential $V_{dd}$ at t10.

Figure 5B:
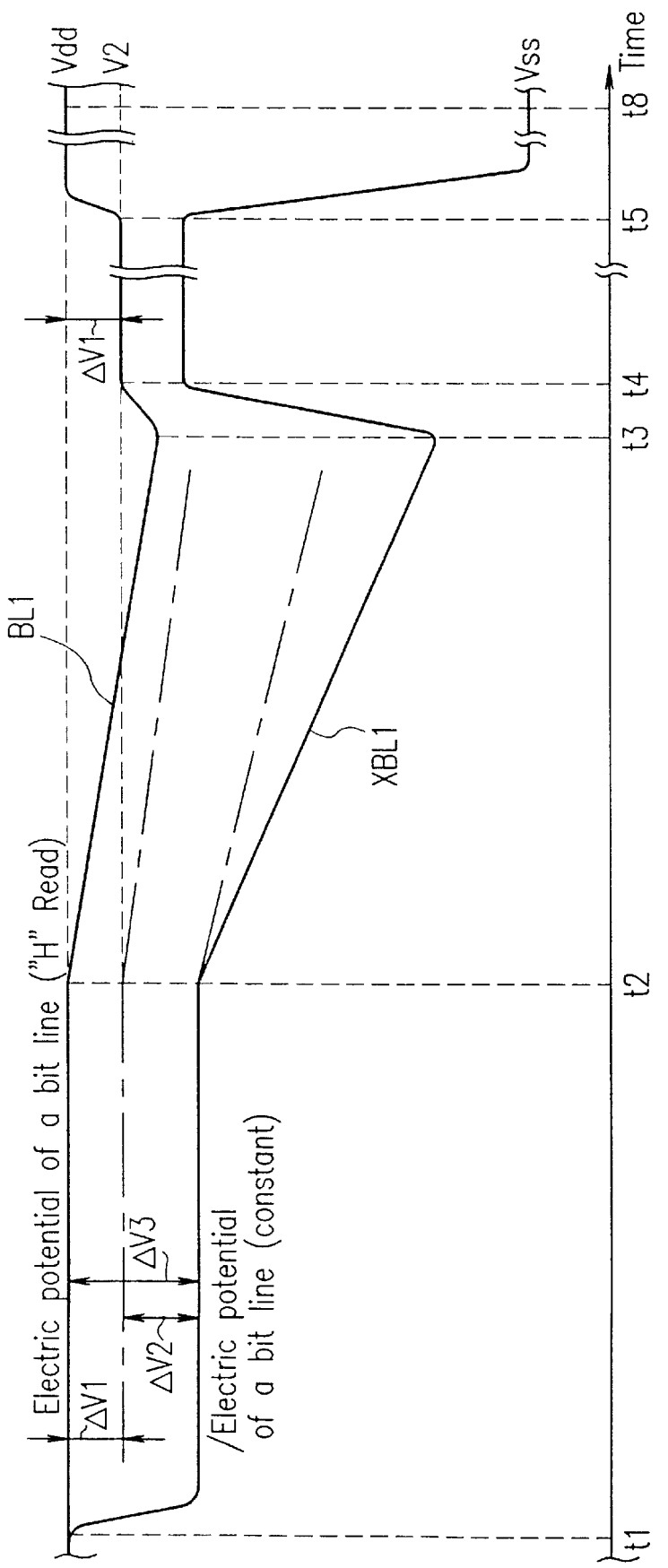
FIG. 5B is a timing diagram illustrating an operation of restoring an electric potential of a local bit line in Embodiment 1 of the present invention.

FIG. 5B shows a timing diagram illustrating a restoration operation of the electric potential of the local bit line BL1. Since the local sense amplifier 11 uses the NMOS transistors alone, the electric potential of the local bit line BL1 decreases from the precharge electric potential $V_{dd}$ by at least about $\Delta V1=0.3$ to 0.5 volts to become a second electric potential V2 at t4. The precharge electric potential $V_{dd}$ is, for example, 3 volts. When the data of the second electric potential V2 is restored (rewritten) in the memory cell MC1 at t8, the data of the second electric potential V2 (which is decreased from the precharge electric potential $V_{dd}$ by $\Delta V1$) is read onto the local bit line BL1 when the data is read from the memory cell MC1 again. Therefore, the potential difference $\Delta V2$ between a pair of the local bit lines BL1 and XBL1 after the decrease in the electric potential by $\Delta V1$ becomes smaller than the potential difference $\Delta V3$ between a pair of the local bit lines BL1 and XBL1 before the decrease in the electric potential by $\Delta V1$. As a result, the sense operation of the local sense amplifier 11 becomes slow. The potential difference $\Delta V2$ becomes about 8/10 to 9/10 of the potential difference $\Delta V3$ at the first read. Therefore, when the data is further continued to be read, the potential difference between the local bit line BL1 and the local bit line XBL1 further decreases, making the sense operation of the local sense amplifier 11 impossible.

As described above with reference to FIG. 5A, the electric potential of the local bit line BL1 is restored to the precharge electric potential $V_{dd}$ from the second electric potential V2 at t5. Therefore, since the potential difference between a pair of the local bit lines BL1 and XBL1 is maintained at the potential difference $\Delta V3$, the potential difference between the local bit line BL1 and the local bit line XBL1 does not decrease due to the repetition of data read. As a result, even when the NMOS transistors alone are used, the local sense amplifier 11 can perform a sense operation repeatedly.

As described above, the local sense amplifier block LSA1 amplifies the potential difference between the local bit lines BL1 and XBL1, in response to which the electric potential of the local bit line BL1 decreases from the precharge electric potential $V_{dd}$ to the second electric potential V2. Furthermore, the global sense amplifier GSA1 amplifies the potential difference between a pair of global bit lines GBL1 and XGBL1, in response to which the electric potential of the local bit line BL1 is restored to the precharge electric potential $V_{dd}$ from the second electric potential V2.

In the present embodiment, the read operation when the High data is stored in the memory cell MC1 has been exemplified. However, the present invention can be similarly applied to the read operation when Low data is stored.

Furthermore, although the case where the NMOS transistors alone are used in the local sense amplifier 11 has been exemplified, the present invention is not limited thereto. PMOS transistors alone may be used in the local sense amplifier 11.

By restoring the electric potential of the local bit line BL1 from the second electric potential V2 to the precharge electric potential $V_{dd}$, a refresh operation for periodically replenishing the charge of the memory cell MC1 can be performed.

Data can also be read from the memory cell MC2 in a manner similar to the above-mentioned procedure of the memory cell MC1. Data can be read from the memory cells MC1 and MC2 simultaneously. It is also contemplated that the word line WL1 selects the memory cells MC1 and MC2 simultaneously, and the simultaneously selected memory cells MC1 and MC2 send data to the global bit lines simultaneously through the local sense amplifier blocks LSA1 and LSA2 to which the memory cells MC1 and MC2 are respectively connected.

Furthermore, when the global bit lines GBL1 and XGBL1 and the global bit lines GBL2 and XGBL2 are arranged in different wiring layers, the area of the semiconductor memory 1 can be made smaller.

FIG. 6 is a timing diagram illustrating an operation of writing data to the memory cell MC1 of the semiconductor memory 1. At t11, the electric potential of the word line WL1 connected to the memory cell MC1 becomes "H". As described above with reference to FIG. 5A, the data from all the memory cells connected to the word line WL1 is read using the local sense amplifier block and global sense amplifier block, and the data read from these memory cells is restored (rewritten). A pair of data buses BS and XBS are precharged to an electric potential to be written.

When the electric potential of the GSA switching signal GCSW21 becomes "H" at t12, the global bit lines GBL1 and XGBL1 are connected to the data buses BS and XBS, respectively, and at t13, the electric potentials of a pair of the global bit lines GBL1 and XGBL1 are changed to a write electric potential (i.e., an electric potential of a pair of data buses). The electric potential of the LSA switching signal LCSW is "H", so that the local bit lines BL1 and XBL1 are connected to a pair of the global bit lines GBL1 and XGBL1, respectively. Therefore, the electric potentials of a pair of the local bit lines BL1 and XBL1 are changed to a write electric potential. When the electric potential of the GSA switching signal GCSW21 shifts from "H" to "L" at t14, a pair of the global bit lines GBL1 and XGBL1 are disconnected from the data buses BS and XBS, respectively.

When the electric potential of the word line WL1 shifts from "H" to "L" at t15, the electric potentials of the local bit lines BL1 and XBL1 are written in the memory cell MC1. When the electric potential of the LSA switching signal LCSW shifts from "H" to "L" at t16, a pair of the local bit lines BL1 and XBL1 are disconnected from a pair of the global bit lines GBL1 and XGBL1, respectively. When the LSA equalizing precharge circuit driving signal LEQ1 and the GSA equalizing precharge circuit driving signal GEQ2 shifts to "H" at t17, a pair of the global bit lines GBL1 and XGBL1 and a pair of the local bit lines BL1 and XBL1 are precharged to "H", respectively, at t18. Thus, the writing of data to the memory cell MC1 is completed.

As described above, in Embodiment 1 of the present invention, the semiconductor memory 1 in which the sense amplifier 11 has a smaller area can be provided. Furthermore, the semiconductor memory 1 in which the imbalance between a pair of the bit lines BL1 and XBL1 is eliminated in the open bit line method can be provided.

Embodiment 2

Figure 7:
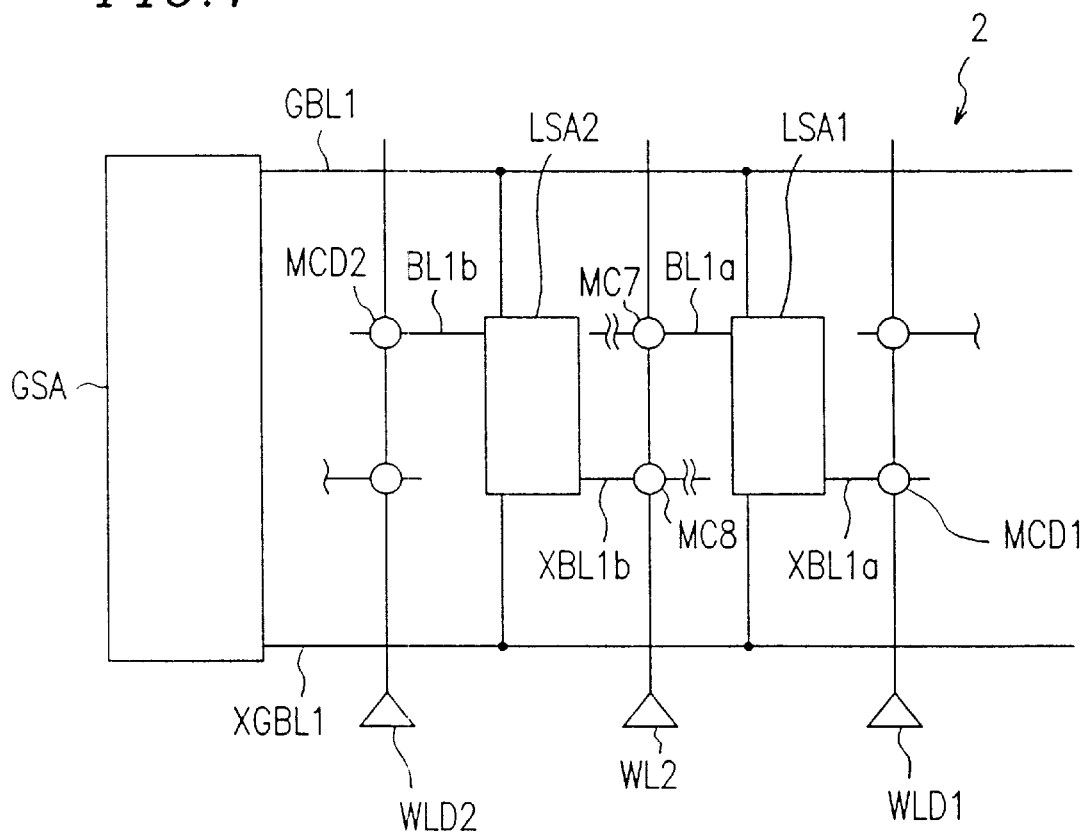
FIG. 7 shows a configuration of a semiconductor memory in Embodiment 2 of the present invention.

FIG. 7 shows a configuration of a semiconductor memory 2. The same elements as those in Embodiment 1 are denoted by the same reference numerals as those therein. The description thereof will be omitted.

In the semiconductor memory 2, two local sense amplifier blocks LSA1 and LSA2 are provided for a pair of global bit lines GBL1 and XGBL1. The semiconductor memory 2 includes memory cells MC7, MCD1, MC8, and MCD2. A pair of local bit lines BL1a and XBL1a are connected to the memory cells MC7 and MCD1, respectively. A pair of local bit lines XBL1b and BL1b are connected to the memory cells MC8 and MCD2, respectively.

The semiconductor memory 2 further includes local sense amplifier blocks LSA1 and LSA2. A pair of common global bit lines GBL1 and XGBL1 are connected to the local sense amplifiers LSA1 and LSA2. The semiconductor memory 2 further includes a global sense amplifier GSA. The global sense amplifier GSA amplifies the potential difference between a pair of the global bit lines GBL1 and XGBL1. A word line WL2 is connected to the memory cells MC7 and MC8. A word line WLD1 is connected to the memory cell MCD1. A word line WLD2 is connected to the memory cell MCD2.

Figure 8:
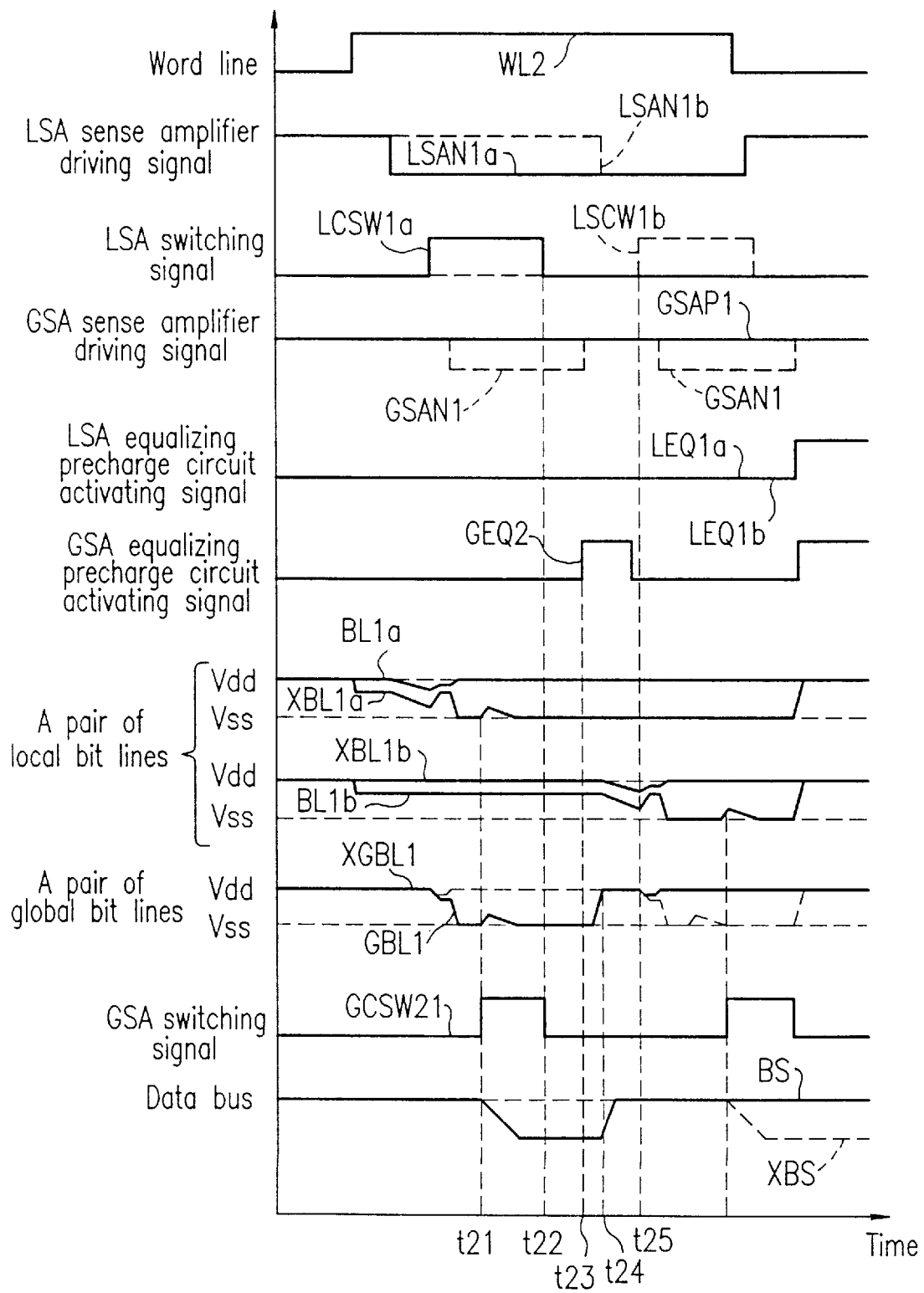
FIG. 8 is a timing diagram illustrating an operation of reading data from a memory cell of the semiconductor memory in Embodiment 2 of the present invention.

FIG. 8 is a timing diagram illustrating a read operation of the semiconductor memory 2. An operation of reading data from the memory cell MC7 to data buses BS and XBS through a pair of the local bit lines BL1a and XBL1a and an operation of reading data from the memory cell MC8 to the data buses BS and XBS through a pair of the local bit lines BL1b and XBL1b are similar to an operation of reading data from the memory cell MC1 to the data buses BS and XBS through a pair of the local bit lines BL1 and XBL1 as described with reference to FIG. 5A.

A pair of the global bit lines GBL1 and XGBL1 are connected to a pair of the local bit lines BL1a, XBL1a, and a pair of the local bit lines BL1b and XBL1b in time division, in response to an LSA switching signals LCSW1a and LCSW1b. When data is read from the memory cells MC7 and MC8 in time division, a pair of the global bit lines GBL1 and XGBL1 are precharged after data is read from the memory cell MC7 and before data is read from the memory cell MC8.

When data is read from a pair of the global bit lines GBL1 and XGBL1 to the data buses BS and XBS at t21, and then the electric potential of the LSA switching signal LCSW1a shifts from "H" to "L" at t22, a pair of the global bit lines GBL1 and XGBL1 are disconnected from a pair of the local bit lines BL1a and XBL1a by the local sense amplifier block LSA1. When a GSA equalizing precharge driving signal GEQ2 becomes "H" at t23, a pair of the global bit lines GBL1 and XGBL1 are precharged at t24. When the electric potential of the LSA switching signal LCSW1b shifts from "L" to "H" at t25, a pair of the global bit lines GBL1 and XGBL1 are connected to a pair of the local bit lines BL1b and XBL1b by the local sense amplifier block LSA2, whereby data is read from the memory cell MC8.

As described above, in Embodiment 2 of the present invention, two local sense amplifier blocks LSA1 and LSA2 are provided for a pair of the global bit lines GBL1 and XGBL1. A pair of the global bit lines GBL1 and XGBL1 are connected to/disconnected from the local sense amplifier blocks LSA1 and LSA2 in time division. Therefore, even when the memory cells MC7 and MC8 are simultaneously turned on by the common word line WL2, data can be read from the memory cells MC7 and MC8.

Figure 9:
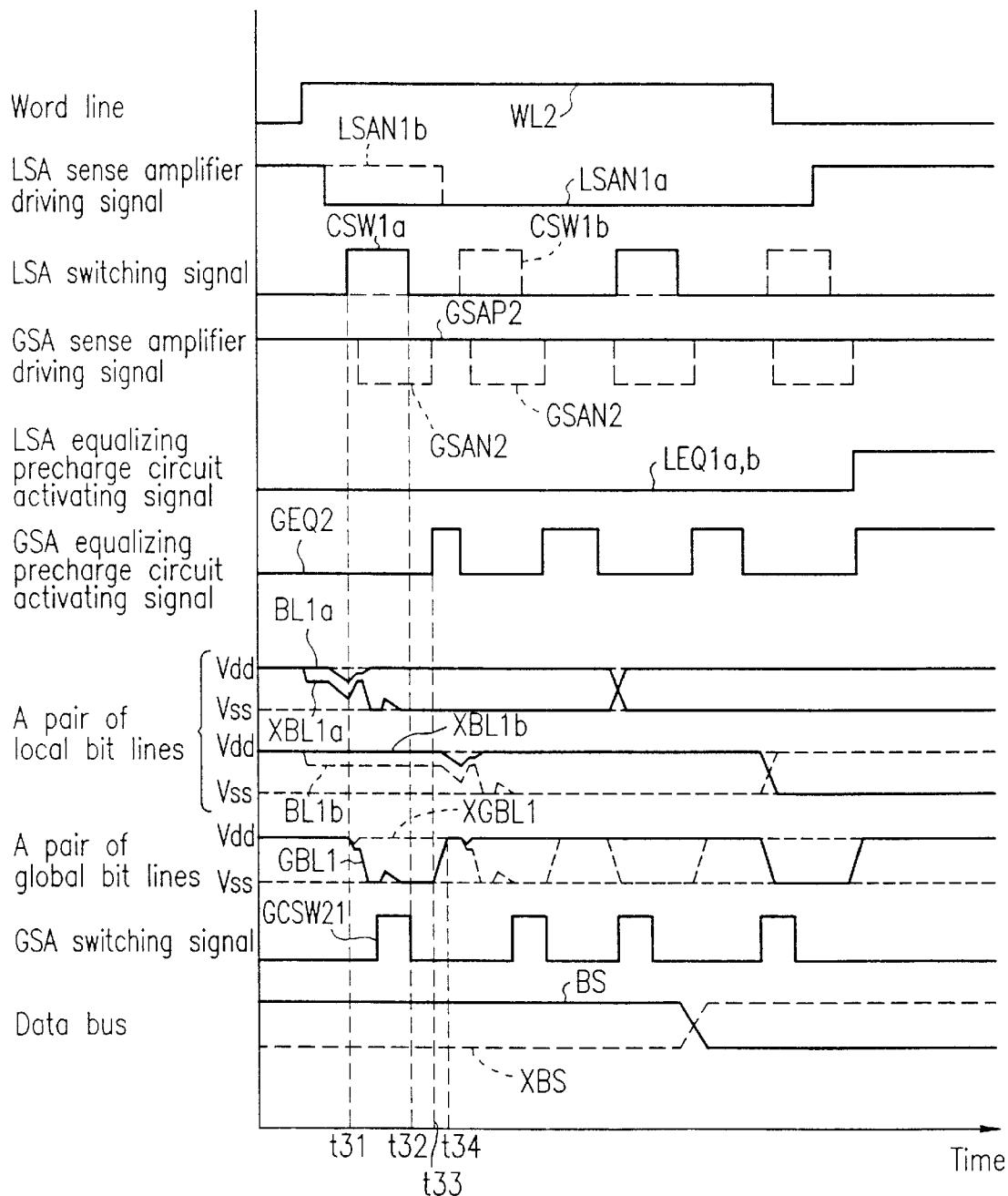
FIG. 9 is a timing diagram illustrating an operation of writing data into the memory cell of the semiconductor memory in Embodiment 2 of the present invention.

FIG. 9 is a timing diagram illustrating a write operation of the semiconductor memory 2. The write operation of the semiconductor memory 2 is performed in time division in a manner similar to that of the semiconductor memory 2 as described above with reference to FIG. 8. The operation of writing data to the memory cells MC7 and MC8 is similar to that of the memory cell MC1 of the semiconductor memory 1 as described in Embodiment 1 with reference to FIG. 6. Data of the memory cell selected by the word line WL2 is restored, and the data to be written to the memory cell MC7 is sent from a pair of the data buses BS and XBS to a pair of the global bit lines GBL1 and XGBL1. When the LSA switching signal CSW1a shifts from "L" to "H" (the LSA switching signal CSW1a is turned on at "H") at t31, a pair of the local bit lines BL1a and XBL1a connected to the local sense amplifier block LSA1 are connected to a pair of the global bit lines GBL1 and XGBL1, and data is written to the memory cell MC7.

When the writing of data to the memory cell MC7 is completed, the LSA switching signal CSW1a shifts from "H" to "L" at t32, and a pair of the local bit lines BL1a and XBL1a are disconnected from a pair of global bit lines GBL1 and XGBL1. Simultaneously, the GCA switching signal GCSW21 shifts from "H" to "L", a pair of the global bit lines GBL1 and XGBL1 are disconnected from the data buses BS and XBS. When the GSA equalizing precharge driving signal GEQ2 shifts from "L" to "H" at t33, a pair of the global bit lines GBL1 and XGBL1 are precharged at t34. Thereafter, data is written in the memory cell MC8 in a process similar to that of the above-mentioned data write operation to the memory cell MC7.

The case where the data is written in the memory cell MC7, and thereafter, a pair of the global bit lines GBL1 and XGBL1 are precharged has been exemplified. However, the present invention is not limited thereto. A pair of the global bit lines GBL1 and XGBL1 may not be precharged.

As described above, in Embodiment 2 of the present invention, a pair of the local bit lines BL1a and XBL1a and a pair of the local bit lines BL1b and XBL1b are connected to a pair of the common global bit lines GBL1 and XGBL1. Therefore, the number of global sense amplifier blocks can be reduced. This allows the area of the semiconductor memory to be decreased.

Embodiment 3

Figure 10:
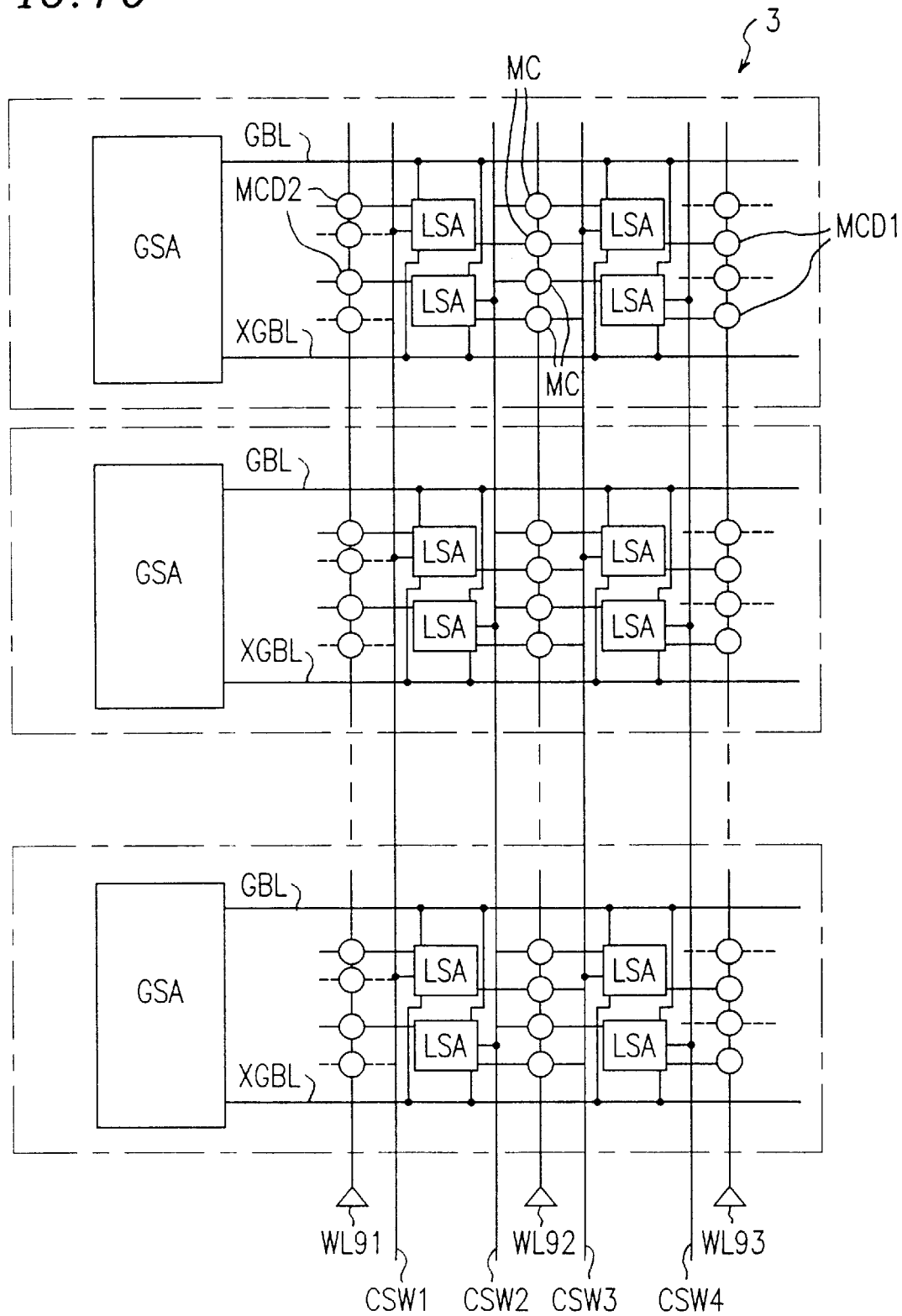
FIG. 10 shows a configuration of a semiconductor memory in Embodiment 3 of the present invention.

FIG. 10 shows a configuration of a semiconductor memory 3. In the semiconductor memory 2 in Embodiment 2 described with reference to FIG. 7, the local sense amplifier blocks LSA1 and LSA2 are arranged in a direction substantially parallel to a pair of the global bit lines GBL1 and XGBL1. However, in the semiconductor memory 3, local sense amplifier blocks LSA are arranged even in a direction perpendicular to a pair of the global bit lines GBL and XGBL. Memory cells MC, MCD1, and MCD2 are respectively connected to a word line WL92, a word line WL93, and a word line WL91. Local sense amplifier blocks LSA are connected to LSA switching signal lines CSW1, CSW2, CSW3, and CSW4.

When the local sense amplifier blocks LSA are arranged even in a direction substantially perpendicular to a pair of the global bit lines GBL and XGBL, the number of the local sense amplifier blocks LSA connected to one global sense amplifier block GSA can be increased. Therefore, if the number of the local sense amplifier blocks LSA is constant, the number of the global sense amplifier blocks GSA can be further reduced. Therefore, the area of the semiconductor memory can be further reduced.

An operation of reading data from each memory cell MC and an operation of writing data to each memory cell MC are performed in time division in a manner similar to the read operation described with reference to FIG. 8 and the write operation described with reference to FIG. 9.

Figure 11:
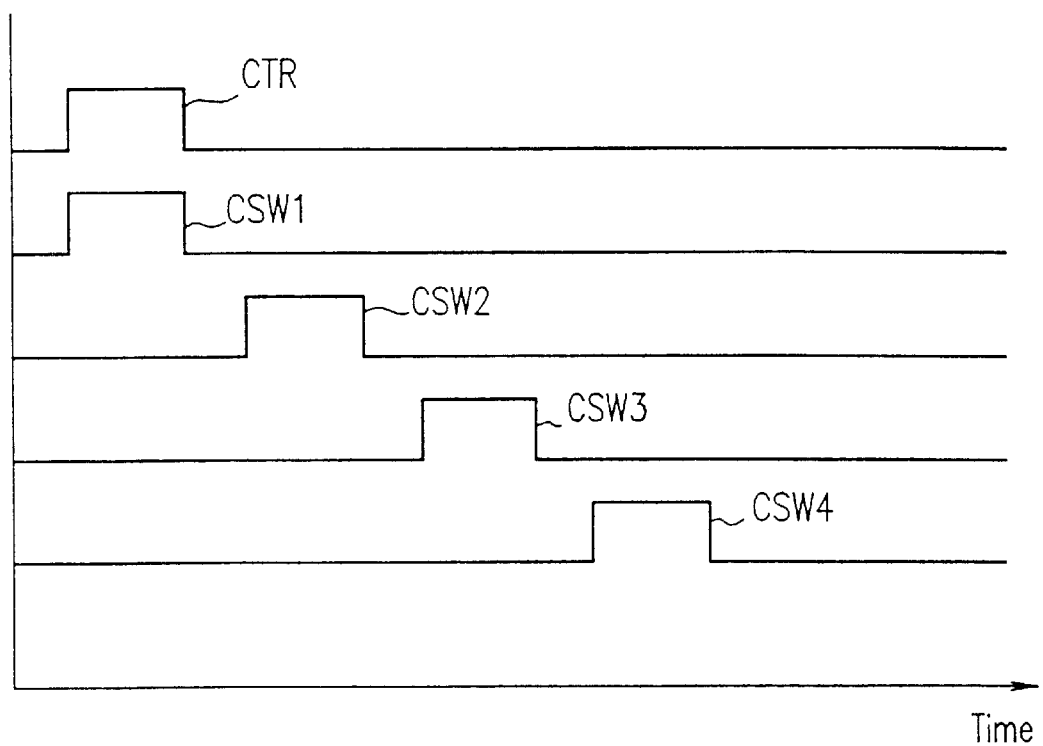
FIG. 11 is a timing diagram of an LSA switching signal in the semiconductor memory in Embodiment 3 of the present invention.

FIG. 11 is a timing diagram of an LSA switching signal in the semiconductor memory 3. LSA switching signals CSW1, CSW2, CSW3, and CSW4 control each switch provided in each local sense amplifier block LSA. In response to the LSA switching signals CSW1, CSW2, CSW3, and CSW4, each switch connects a pair of the local bit lines to a pair of the global bit lines or disconnects a pair of the local bit lines from a pair of the global bit lines. The LSA switching signals CSW1 to CSW4 are generated based on a single signal CTR input from outside of the semiconductor memory 3.

In the case where the LSA switching signals CSW1 to CSW4 are individually generated, it is required that addresses corresponding to the LSA switching signals CSW1 to CSW4 are input from outside of the semiconductor memory. In the case where the LSA switching signals CSW1 to CSW4 are generated based on the signal CTR, only a single address corresponding to a single signal CTR should be input from outside of the semiconductor memory. Therefore, the number of addresses input from outside of the semiconductor memory can be reduced. The generation of an LSA switching signal based on the signal CTR is also applicable to the above-mentioned Embodiment 2 and Embodiment 4 described below.

Embodiment 4

Figure 12:
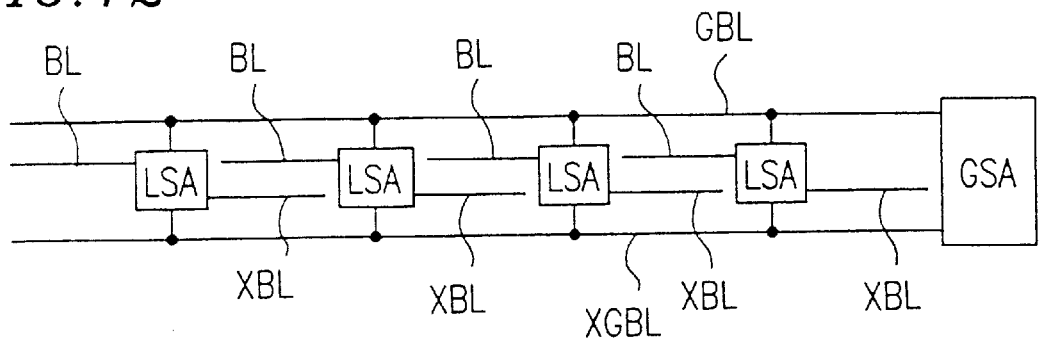
FIG. 12 is a conceptual diagram illustrating an arrangement of a pair of local bit lines and a pair of global bit lines in Embodiments 1 to 3 of the present invention.

FIG. 12 is a conceptual diagram illustrating an arrangement between a pair of the local bit lines and a pair of the global bit lines in Embodiments 1 to 3. A pair of the global bit lines GBL and XGBL are arranged in a direction substantially parallel to a pair of the local bit lines BL and XBL. Since there is a limit to the length of a pair of the global bit lines GBL and XGBL, when a pair of the global bit lines GBL and XGBL are arranged in a direction substantially parallel to a pair of the local bit lines BL and XBL, the number of the local sense amplifier blocks LSA which can be connected to one global sense amplifier block GSA is considerably limited.

Figure 13:
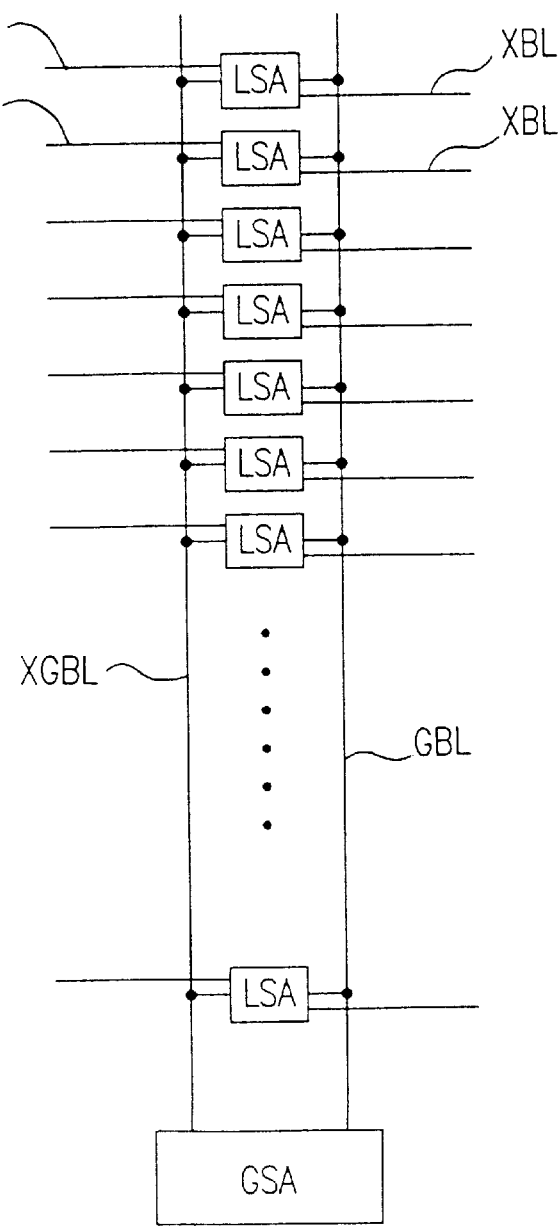
FIG. 13 is a conceptual diagram illustrating an arrangement between a pair of local bit lines and a pair of global bit lines in Embodiment 4 of the present invention.

FIG. 13 is a conceptual diagram illustrating an arrangement between a pair of the local bit lines and a pair of the global bit lines in Embodiment 4 of the present invention. A pair of the global bit lines GBL and XGBL are arranged in a direction perpendicular to a pair of the local bit lines BL and XBL. When a pair of the global bit lines GBL and XGBL are arranged in a direction substantially perpendicular to a pair of the local bit lines BL and XBL, the number of the local sense amplifier blocks LSA which can be connected to one global sense amplifier block GSA remarkably increases. For example, about 50 local sense amplifier blocks LSA can be connected to one global sense amplifier block GSA. Therefore, if the number of the local sense amplifier blocks LSA is constant, the number of global sense amplifier blocks GSA can be remarkably reduced. Since the local sense amplifier blocks LSA use the NMOS transistors alone in the local sense amplifier 11, the layout area can be made smaller, compared with the global sense amplifier block GSA. A number of local sense amplifiers with a small area can be used, so that the area of the semiconductor memory can be further reduced.

Figure 14:
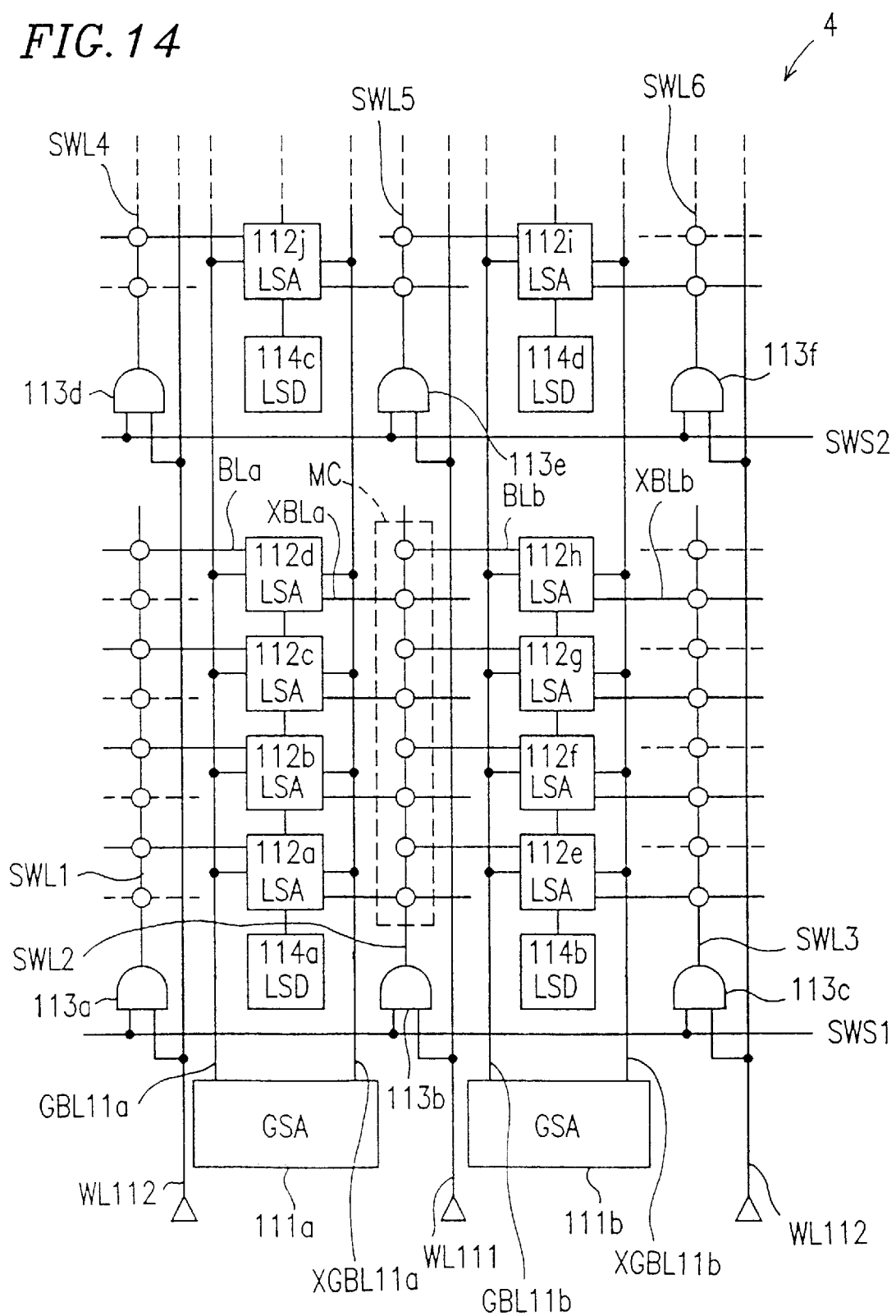
FIG. 14 is a circuit diagram of a semiconductor memory in Embodiment 4 of the present invention.

FIG. 14 shows a circuit configuration of a semiconductor memory 4. In the semiconductor memory 4, a pair of global bit lines GBL11a, XGBL11a, and GBL11b, XGBL11b are arranged in a direction substantially perpendicular to a pair of local bit lines BLa, XBLa, and BLb, XBLb. The semiconductor memory 4 includes a memory cell group MC, word lines WL111, WL112, sub-word lines SWL1 to SWL6, local sense amplifier blocks 112a to 112j, global sense amplifier blocks 111a, 111b, sub-word line drivers 113a to 113f, local sense amplifier drivers 114a to 114d, a pair of global bit lines GBL11a, XGBL11a, and GBL11b, XGBL11b, a pair of local bit lines BLa, XBLa, and BLb, XBLb, and sub-word line selection signal lines SWS1, SWS2.

A pair of the global bit lines GBL11a, XGBL11a, and GBL11b, XGBL11b are arranged in a direction substantially parallel to the word line WL111. The global sense amplifier blocks 111a, 111b are arranged in a direction substantially parallel to a pair of the local bit lines BLa, XBLa, and BLb, XBLb. The word lines WL111, WL112 are divided into sub-word lines SWL1 to SWL6.

The case where two memory cells are connected to one local sense amplifier block has been exemplified. However, the present invention is not limited thereto. Three or more memory cells may be connected to one local sense amplifier block. The case where four local sense amplifier blocks are connected to one sub-word line has been exemplified. However, the present invention is not limited thereto. Five or more local sense amplifier blocks may be connected to one sub-word line. Three or less local sense amplifier blocks may be connected to one sub-word line.

When the word line WL111 and the sub-word line selection signal line SWS1 simultaneously become "H", the sub-word line SWL2 becomes "H", and the memory cell group MC connected to the sub-word line SWL2 is selected. Data of the selected memory cell group MC is transferred to the local sense amplifier blocks 112a to 112h through a pair of the local bit line to which each memory cell is connected.

Data transferred to the respective local sense amplifier blocks 112a to 112d is read in time division by the global sense amplifier 111a in a manner similar to the read operation described in Embodiment 2 with reference to FIG. 8. Furthermore, data transferred to the respective local sense amplifier blocks 112e to 112h is read in time division by the global sense amplifier block 111b. The data write operation can also be performed in a manner similar to the write operation described in Embodiment 2 with reference to FIG. 9, with only the method for selecting word lines being different.

As described above, according to the present invention, a semiconductor memory with a decreased area of a sense amplifier can be provided. Furthermore, a semiconductor memory with the imbalance between a pair of bit lines eliminated in an open bit line method can be provided.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor memory, comprising:
   a plurality of memory cells;
   a pair of local bit lines connected to the plurality of memory cells;
   a local sense amplifier for amplifying a potential difference between the pair of local bit lines;
   a pair of global bit lines electrically connected to the pair of local bit lines through a switch; and
   a global sense amplifier for amplifying a potential difference between the pair of global bit lines,
   wherein the local sense amplifier includes a plurality of transistors,
   each of the plurality of transistors included in the local sense amplifier is a transistor of a first conductivity type, and the local sense amplifier does not include transistors of a conductivity type different from the first conductivity type, and
   the global sense amplifier includes a transistor of a second conductivity type different from the first conductivity type.

2. A semiconductor memory according to claim 1, wherein the transistor of the first conductivity type is an NMOS transistor, and the transistor of the second conductivity type is a PMOS transistor.

3. A semiconductor memory according to claim 1, wherein the pair of local bit lines includes a first local bit line and a second local bit line, and
   a length of the first local bit line is substantially equal to a length of the second local bit line.

4. A semiconductor memory according to claim 3, wherein the plurality of memory cells includes a first memory cell and a second memory cell,
   the transistors of the first conductivity include a first transistor and a second transistor,
   each of the first transistor and the second transistor has a source, a gate, and a drain,
   the first local bit line is connected to the gate of the second transistor and a first node, the second local bit line is connected the gate of the first transistor and a second node, the first local bit line includes a first end portion on the first memory cell side with respect to the local sense amplifier, the second local bit line includes a second end portion on the second memory cell side with respect to the local sense amplifier, and a first distance between the first node and the first end portion is substantially equal to a second distance between the second node and the second end portion.

5. A semiconductor memory according to claim 3, wherein the plurality of memory cells includes a first memory cell and a second memory cell, the transistors of first conductivity include a first transistor and a second transistor, each of the first transistor and the second transistor has a source, a gate, and a drain, the first local bit line is connected to the drain of the first transistor and a first node, the second local bit line is connected to the drain of the second transistor and a second node, the first local bit line includes a first end portion on the first memory cell side with respect to the local sense amplifier, the second local bit line has a second end portion on the second memory cell side with respect to the local sense amplifier, and a first distance between the first node and the first end portion is substantially equal to a second distance between the second node and the second end portion.

6. A semiconductor memory according to claim 1, wherein the pair of local bit lines includes a first local bit line, and the global sense amplifier amplifies a potential difference between the pair of global bit lines, in response to which an electric potential of the first local bit line is restored to a predetermined first electric potential.

7. A semiconductor memory according to claim 6, wherein the predetermined first electric potential is a precharge electric potential for precharging the pair of local bit lines.

8. A semiconductor memory according to claim 7, wherein the transistor of the first conductivity type is an NMOS transistor, the transistor of the second conductivity type is a PMOS transistor, the local sense amplifier amplifies a potential difference between the pair of local bit lines, in response to which an electric potential of the first local bit line decreases to a second electric potential lower than the precharge electric potential from the precharge electric potential, and the global sense amplifier amplifies a potential difference between the pair of global bit lines, in response to which an electric potential of the first local bit line is restored to the precharge electric potential from the second electric potential.

9. A semiconductor memory according to claim 1, wherein the pair of global bit lines are electrically connected to a plurality of the pairs of local bit lines through the switch.

10. A semiconductor memory according to claim 9, wherein the pair of global bit lines are electrically connected to each of the plurality of pairs of local bit lines in time division.

11. A semiconductor memory according to claim 10, wherein the pair of global bit lines are electrically connected to each of the plurality of pairs of local bit lines in time division in response to a single external signal.

12. A semiconductor memory according to claim 1, wherein the pair of global bit lines are arranged in a direction crossing the pair of local bit lines.

13. A semiconductor memory, comprising:

a plurality of memory cells;

a pair of local bit lines connected to the plurality of memory cells;

a local sense amplifier for amplifying a potential difference between the pair of local bit lines;

a pair of global bit lines electrically connected to the pair of local bit lines through a switch; and a global sense amplifier for amplifying a potential difference between the pair of global bit lines, wherein the local sense amplifier includes a plurality of transistors, each of the plurality of transistors included in the local sense amplifier is a transistor of a first conductivity type, the global sense amplifier includes a transistor of a second conductivity type different from the first conductivity type, the pair of local bit lines includes a first local bit line and a second local bit line, a length of the first local bit line is substantially equal to a length of the second local bit line, the plurality of memory cells includes a first memory cell and a second memory cell, the transistors of the first conductivity include a first transistor and a second transistor, each of the first transistor and the second transistor has a source, a gate, and a drain, the first local bit line is connected to the gate of the second transistor and a first node, the second local bit line is connected to the gate of the first transistor and a second node, the first local bit line includes a first end portion of the first memory cell side with respect to the local sense amplifier, the second local bit line includes a second end portion on the second memory cell side with respect to the local sense amplifier, and a first distance between the first node and the first end portion is substantially equal to a second distance between the second node and the second end portion.

14. A semiconductor memory, comprising:

a plurality of memory cells;

a pair of local bit lines connected to the plurality of memory cells;

a local sense amplifier for amplifying a potential difference between the pair of local bit lines;

a pair of global bit lines electrically connected to the pair of local bit lines through a switch; and a global sense amplifier for amplifying a potential difference between the pair of global bit lines, wherein the local sense amplifier includes a plurality of transistors, each of the plurality of transistors included in the local sense amplifier is a transistor of a first conductivity type, the global sense amplifier includes a transistor of a second conductivity type different from the first conductivity type, the pair of local bit lines includes a first local bit line and a second local bit line, a length of the first local bit line is substantially equal to a length of the second local bit line, the plurality of memory cells includes a first memory cell and a second memory cell, the transistors of the first conductivity include a first transistor and a second transistor, each of the first transistor and the second transistor has a source, a gate, and a drain, the first local bit line is connected to the drain of the first transistor and a first node, the second local bit line is connected to the drain of the second transistor and a second node, the first local bit line includes a first end portion on the first memory cell side with respect to the local sense amplifier, the second local bit line includes a second end portion on the second memory cell side with respect to the local sense amplifier, and a first distance between the first node and the first end portion is substantially equal to a second distance between the second node and the second end portion.

15. A semiconductor memory, comprising:

a plurality of memory cells;

a pair of local bit lines connected to the plurality of memory cells;

a local sense amplifier for amplifying a potential difference between the pair of local bit lines;

a pair of global bit lines electrically connected to the pair of local bit lines through a switch; and a global sense amplifier for amplifying a potential difference between the pair of global bit lines, wherein the local sense amplifier includes a plurality of transistors, each of the plurality of transistors included in the local sense amplifier is a transistor of a first conductivity type, the global sense amplifier includes a transistor of a second conductivity type different from the first conductivity type, the pair of local bit lines includes a first local bit line, and the global sense amplifier amplifies a potential difference between the pair of global bit lines, in response to which an electric potential of the first local bit line is restored to a predetermined first electric potential.

16. A semiconductor memory according to claim 15, wherein the predetermined first electric potential is a precharge electric potential for precharging the pair of local bit lines.

17. A semiconductor memory according to claim 16, wherein the transistor of the first conductivity type is an NMOS transistor, the transistor of the second conductivity type is a PMOS transistor, the local sense amplifier amplifies a potential difference between the pair of local bit lines, in response to which an electric potential of the first local bit line decreases to a second electric potential lower than the precharge electric potential from the precharge electric potential, and the global sense amplifier amplifies a potential difference between the pair of global bit lines, in response to which an electric potential of the first local bit line is restored to the precharge electric potential from the second electric potential.

18. A semiconductor memory, comprising:

a plurality of memory cells;

a pair of local bit lines connected to the plurality of memory cells;

a local sense amplifier for amplifying a potential difference between the pair of local bit lines;

a pair of global bit lines electrically connected to the pair of local bit lines through a switch; and a global sense amplifier for amplifying a potential difference between the pair of global bit lines, wherein the local sense amplifier includes a plurality of transistors, each of the plurality of transistors included in the local sense amplifier is a transistor of a first conductivity type, the global sense amplifier includes a transistor of a second conductivity type different from the first conductivity type, the pair of global bit lines are electrically connected to a plurality of the pairs of local bit lines through the switch, and the pair of global bit lines are electrically connected to each of the plurality of pairs of local bit lines in time division.

19. A semiconductor memory according to claim 18, wherein the pair of global bit lines are electrically connected to each of the plurality of pairs of local bit lines in time division in response to a signal external signal.

20. A semiconductor memory, comprising:

a plurality of memory cells;

a pair of local bit lines connected to the plurality of memory cells;

a local sense amplifier for amplifying a potential difference between the pair of local bit lines;

a pair of global bit lines electrically connected to the pair of local bit lines through a switch; and a global sense amplifier for amplifying a potential difference between the pair of global bit lines, wherein the local sense amplifier includes a plurality of transistors, each of the plurality of transistors included in the local sense amplifier is a transistor of a first conductivity type, and the pair of global bit lines are arranged in a direction crossing the pair of local bit lines.

* * * * *